United States Patent
Zhao et al.

(10) Patent No.: US 9,680,070 B2
(45) Date of Patent: Jun. 13, 2017

(54) LED LIGHT SOURCE PERFORMANCE COMPENSATION APPARATUS, DEVICE AND APPLICATION THEREOF

(71) Applicant: SICHUAN SUNFOR LIGHT CO., LTD., Sichuan, Chengdu (CN)

(72) Inventors: Kun Zhao, Chengdu (CN); Sen Wang, Chengdu (CN); Beidou Liu, Chengdu (CN)

(73) Assignee: SICHUAN SUNFOR LIGHT CO., LTD, Sichuan (CN)

( * ) Notice: Subject to any disclaimer, the term of this patent is extended or adjusted under 35 U.S.C. 154(b) by 0 days.

(21) Appl. No.: 15/026,787

(22) PCT Filed: Oct. 14, 2014

(86) PCT No.: PCT/CN2014/088533
§ 371 (c)(1),
(2) Date: Apr. 1, 2016

(87) PCT Pub. No.: WO2015/055106
PCT Pub. Date: Apr. 23, 2015

(65) Prior Publication Data
US 2016/0254422 A1    Sep. 1, 2016

(30) Foreign Application Priority Data
Oct. 15, 2013   (CN) .......................... 2013 1 0481837

(51) Int. Cl.
*H01L 21/00*   (2006.01)
*H01L 33/50*   (2010.01)
(Continued)

(52) U.S. Cl.
CPC .......... *H01L 33/505* (2013.01); *H01L 33/502* (2013.01); *H01L 33/54* (2013.01);
(Continued)

(58) Field of Classification Search
CPC ................................ H01L 33/60; H01L 33/20
(Continued)

(56) References Cited

U.S. PATENT DOCUMENTS

2003/0107887 A1*   6/2003   Eberl ................... H01L 25/167
362/227
2011/0089815 A1    4/2011   Yeh et al.

FOREIGN PATENT DOCUMENTS

| CN | 102231418 A | 11/2011 |
| CN | 102637808 A | 8/2012 |

(Continued)

OTHER PUBLICATIONS

International Search Report of International Application No. PCT/CN2014/088533 mailed Jan. 13, 2015.

*Primary Examiner* — Jami M Valentine
(74) *Attorney, Agent, or Firm* — Michael Ye; Andrews Kurth Kenyon LLP

(57) ABSTRACT

An LED light source performance compensation apparatus and a white-light LED light-emitting device. The LED light source performance compensation apparatus comprises: a light transmissive supporting member (101), wherein the light transmissive supporting member (101) is provided with a light performance parameter regulation member (102); and after secondary light of which the wavelength is 380 nm-780 nm and which is emitted by an LED light source (103) passes through the performance compensation apparatus, light performance parameters are adjusted. The LED light source performance compensation apparatus can effectively regulate the light performance parameters of the LED light source, thereby remedying the defects of the secondary light emitted by an existing finished LED light source in terms of light performance parameters.

14 Claims, 6 Drawing Sheets

(51) Int. Cl.
*H01L 33/54* (2010.01)
*F21K 9/64* (2016.01)

(52) U.S. Cl.
CPC .............. *F21K 9/64* (2016.08); *H01L 33/504* (2013.01); *H01L 33/507* (2013.01); *H01L 33/508* (2013.01)

(58) Field of Classification Search
USPC ................ 257/98, 325.032; 438/22; 340/815
See application file for complete search history.

(56) References Cited

FOREIGN PATENT DOCUMENTS

| | | |
|---|---|---|
| CN | 103219450 A | 7/2013 |
| CN | 103337584 A | 10/2013 |
| JP | 2010283221 A | 12/2010 |

\* cited by examiner

LED LIGHT SOURCE PERFORMANCE COMPENSATION APPARATUS, DEVICE AND APPLICATION THEREOF

This application claims the priority of the Chinese patent application, with the application no. 201310481837.8, filed with State Intellectual Property Office of China on 15 Oct. 2013 and entitled "LED Light Source Performance Compensation Apparatus, Device and Application Thereof", which prior application is incorporated herein by reference in its entirety.

FIELD OF THE INVENTION

The present invention relates to a light source performance compensation apparatus, a device and an application thereof and, particularly, to an LED light source performance compensation apparatus, a device and an application thereof.

BACKGROUND

With regard to the existing light sources that generate white light for lighting, from initial incandescent lamps and fluorescent lamps to relatively new LED light sources that are currently used, these light sources mentioned above generally cause, when generating white light, that the white light generated thereby exists certain deficiency in performance due to the limitation of factors, such as the compositional design or the structural design of the light sources per se.

For example, the existing white-light LED commonly used. The LED (light-emitting diode) device, as a novel solid light source, not only has the advantages of a low power consumption, a small volume, a fast response speed, a long working life, being liable to light adjustment and colour adjustment, being energy saving and environmentally friendly, etc., but also gains significant advantages over traditional light sources, such as an incandescent lamp and a fluorescent lamp, in terms of production, manufacturing and applicability, and therefore it has obtained considerable developments since it was born in the sixties. At present, the LED device has been widely applied in a plurality of fields of lighting, such as street lamp lighting, landscape lighting, large screen display, traffic lights and interior lighting.

The existing LED light sources are mainly obtained by exciting yellow luminescent powder with blue light, or exciting red, yellow and green luminescent powder with a blue light chip, while the traditional process is to mix the yellow luminescent powder and silica gel and then coat the mixture on the blue light chip, and cure the silica gel by heating, or to make the LED device by arranging the luminescent powder and the blue chip apart.

However, it can only be determined whether an LED device formed by means of a traditional process complies with the performance requirements, i.e. whether the performances, such as a colour temperature, a colour rendering index, a colour tolerance, a fluctuation depth, light effect and an light emergent angle, are within target ranges, by testing a finished LED light source, and if the performances exceed the target ranges, the device is an unqualified product. With regard to such an unqualified product, the existing manufacturers generally cannot effectively process it.

SUMMARY OF THE INVENTION

In view of this, the present invention provides an LED light source performance compensation apparatus, which can effectively regulate light performance parameters of an LED light source, thereby remedying the defects of the secondary light emitted by an existing finished LED light source in terms of light performance parameters.

In order to solve the above-mentioned technical problem, the technical solution of a first aspect provided in the present invention is an LED light source performance compensation apparatus, comprising: a light transmissive supporting member, wherein the light transmissive supporting member is provided with a light performance parameter regulation member; and after secondary light of which the wavelength is 380 nm-780 nm and which is emitted by an LED light source passes through the performance compensation apparatus, light performance parameters are adjusted.

The technical solution of a second aspect provided in the present invention is a preparation method for the aforementioned LED light source performance compensation apparatus, the light source performance compensation apparatus comprising a light wavelength conversion component and a light transmissive binding material, the light wavelength conversion component is fluorescent powder or a fluorescent film; several grooves are provided on the light transmissive supporting member, and the light transmissive binding material is provided in the grooves; the fluorescent powder or the fluorescent film is provided in the light transmissive binding material; and the light source performance compensation apparatus is prepared by using an IMD process, wherein the IMD process is any one selected from IML, IMF and IMR.

The technical solution of a third aspect provided in the present invention is an application of the aforementioned LED light source performance compensation apparatus in regulation of light performance parameters of secondary light of which the wavelength is 380 nm-780 nm and which is emitted by an LED light source.

The technical solution of a fourth aspect provided in the present invention is a white-light LED light-emitting device, comprising: a white-light LED light source and an LED light source performance compensation apparatus, wherein the LED light source performance compensation apparatus comprises: a light transmissive supporting member, wherein the light transmissive supporting member is provided with a light performance parameter regulation member; the light performance parameter regulation member comprises a light wavelength conversion component and/or a light transmissive binding material; and after white light emitted by the white-light LED light source passes through the performance compensation apparatus, light performance parameters are adjusted.

The LED light source of the present invention is a concept relative to the existing LED chips, and light emitted by the LED chip is light directly emitted from a semiconductor constituting the chip, i.e. primary light. However, the light emitted by the LED light source of the present invention is secondary light, i.e. the secondary light generated after wavelength conversion is performed via an existing light wavelength conversion component, such as fluorescent powder, on the primary light emitted from the semiconductor of the chip, wherein the secondary light emitted by the LED light source is visible light of which the wavelength is 380 nm-780 nm.

The LED light source performance compensation apparatus of the present invention is applied to regulation of the existing LED light source in performance, and the main principle of regulation thereof is to regulate light performance parameters of secondary light emitted by an LED light source via a light performance parameter regulation member, e.g., the combination of a light wavelength conversion component and/or a light transmissive binding material with a light transmissive supporting member, for example, non-afterglow luminescent powder or afterglow luminescent powder in the light wavelength conversion component can be used to regulate an afterglow time thereof, or luminescent powder, such as fluorescent powder, with different colours can be used to regulate the light performance parameters, such as a colour temperature, the light effect, a colour rendering index, a colour tolerance, an emitted light colour, a proportion of blue light and a fluctuation depth, of the secondary light emitted by the LED light source, and thus the LED light source performance compensation apparatus is especially suitable for white light emitted by the existing finished white-light LED light source.

The present invention is to regulate light performance parameters of the existing finished LED light source product by adding the LED light source performance compensation apparatus of the present invention to the periphery of the LED light source and using the function of a light performance parameter regulation member, such as a light wavelength conversion component and/or a light transmissive binding material.

The light wavelength conversion component of the present invention can be a type of luminescent powder, which is a kind of luminescent powder for an LED. The existing luminescent powder can be divided into three kinds: fluorescent powder, phosphorescence powder and afterglow powder.

The light transmissive binding material of the present invention can be a solid glue and a semi-solid glue at normal temperature: the form of elastic gel, brittle gel and jelly; and the use of the elastic gel in a mounting process can facilitate matching and mounting a protruded LED light source lamp bead.

The light source performance compensation apparatus of the present invention can also regulate the light effect of the light emitted by the LED light source by separately providing the light transmissive binding material, and can also further preferably combine the light transmissive binding material with the light wavelength conversion component so as to realize the regulation of the combination of the above-mentioned various performances.

DETAILED DESCRIPTION

To help those skilled in the art better understand the technical solutions of the present invention, the present invention will be further described in detail in combination with particular embodiments below.

The fluorescent film of the present invention is a film made from fluorescent powder. The present invention preferably uses the fluorescent powder or a fluorescent film as a light wavelength conversion component, which can also select different fluorescent powder or fluorescent films to regulate different performance parameters of light according to different requirements, in addition to regulating the wavelength of light. For example, when only a light transmissive binding material is used, the light effect of secondary light emitted by an LED light source can be regulated; and the refractive index of the light transmissive binding material is greater than that of the air, so that the light effect of the secondary light can be changed by changing the angle of light refraction. The light wavelength conversion component can also be used alone, which functions, by means of wavelength convention, to regulate the performance parameters, such as the colour, the proportion of blue light, the colour temperature and the colour tolerance, of the secondary light emitted by the LED light source. The combination of the light transmissive binding material and the light wavelength conversion component can also be further used, especially the fluorescent powder or the fluorescent film, etc., thereby functioning to regulate the performance parameters, such as the colour temperature, the light effect, the colour rendering index, the colour tolerance, the emitted light colour, the proportion of blue light and the fluctuation depth, of the secondary light emitted by the LED light source.

The following are only some of the preferred embodiments of the present invention, and the protection scope of the present invention is not limited to the embodiments cited in the present invention.

Figure 1:
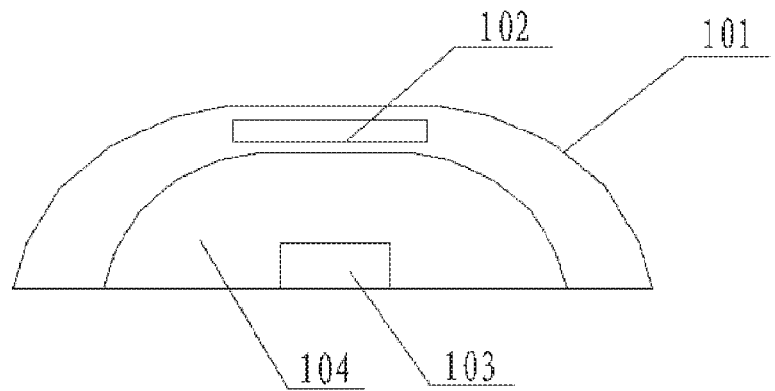
FIGS. 1-4 are structural schematic diagrams of particular embodiments of an LED light source performance compensation apparatus of the present invention in Embodiment I.
Figure 2:
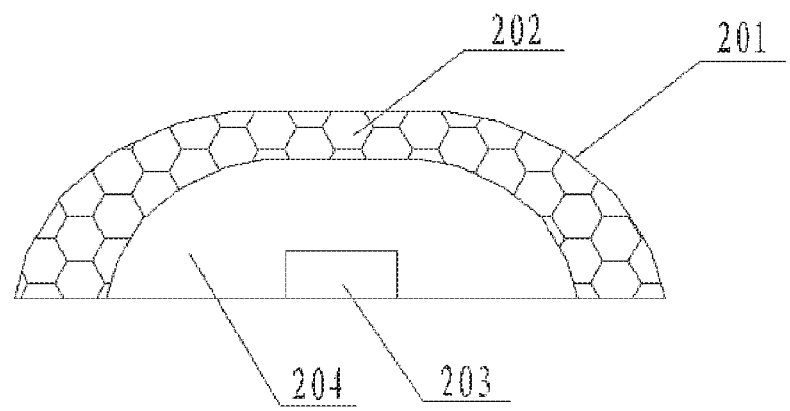

Embodiment I: A Light Performance Parameter Regulation Member is Located Inside a Light Transmissive Supporting Member As shown in FIGS. 1-2, the LED light source performance compensation apparatus comprises a light transmissive supporting member and a light performance parameter regulation member, wherein the light performance parameter regulation member is located inside the light transmissive supporting member. The LED light source performance compensation apparatus covers the periphery of an LED light source, wherein an intervening connection part between the LED light source and the LED light source performance compensation apparatus can be filled with gas, such as air, nitrogen and helium, and can also be in a vacuum state, and even the approach of completely or partially filling the above-mentioned intervening connection part with a light transmissive binding material can be used.

The light performance parameter regulation member can be a light wavelength conversion component which can be formed as a film separately or be provided inside the light transmissive supporting member in a dispersed manner, with reference to the schematic diagram of FIG. 1 or 2.

FIG. 1 is a structural schematic diagram of an implementation in which a light wavelength conversion component is formed as a film separately and provided inside a light transmissive supporting member, comprising a light wavelength conversion component 102, a light transmissive supporting member 101 and an LED light source 103; and a part 104 between the light transmissive supporting member 101 and the LED light source 103 can be gas: such as air, nitrogen and helium, and can also be in a vacuum state; and the light wavelength conversion component 102 shown in FIG. 1 can be preferably a luminescent film in luminescent powder, and can even be further preferably a fluorescent film.

FIG. 2 is a structural schematic diagram of an implementation in which a light wavelength conversion component is provided inside a light transmissive supporting member in a dispersed manner, comprising a light wavelength conversion component 202, a light transmissive supporting member 201 and an LED light source 203; and a part 204 between the light transmissive supporting member 201 and the LED light source 203 can be gas: such as air, nitrogen and helium, and can also be in a vacuum state.

The LED light source in FIG. 1 or 2 can be preferably a white-light LED light source, and can even be further preferably an LED chip that emits blue light, wherein the periphery of the LED chip is provided with a white-light LED light source having yellow-light fluorescent powder or blue, green and red-light fluorescent powder.

Figure 3:
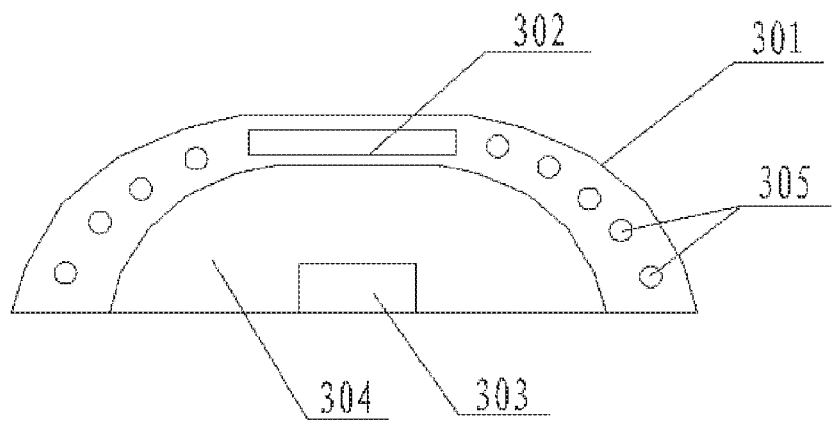
Figure 4:
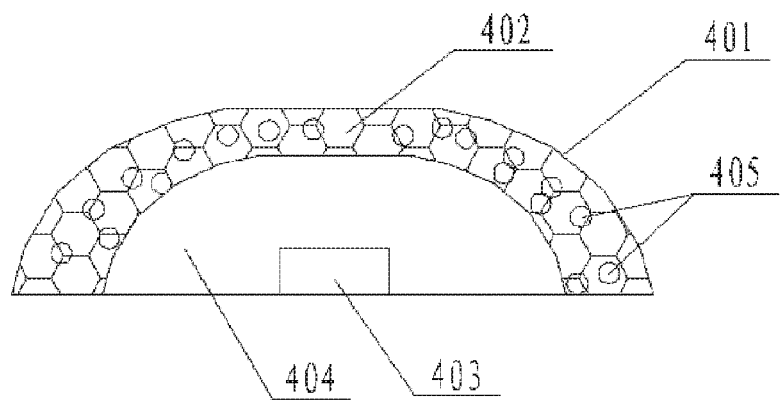

The light performance parameter regulation member can also be a light wavelength conversion component and a light transmissive binding material, which can use the approach of mixing by film forming or being dispersedly located inside a light transmissive supporting member, with reference to the schematic diagram of FIG. 3 or 4.

FIG. 3 is a structural schematic diagram of the implementation in which a light wavelength conversion component and a light transmissive binder are mixed by film forming and provided inside a light transmissive supporting member, comprising a light wavelength conversion component 302, a light transmissive binder 305, a light transmissive supporting member 301 and an LED light source 303; and a part 304 between the light transmissive supporting member 301 and the LED light source 303 can be gas: such as air, nitrogen and helium, and can also be in a vacuum state; and the light wavelength conversion component 302 shown in FIG. 3 can be preferably a luminescent film in luminescent powder, and can even be further preferably a fluorescent film.

FIG. 4 is a structural schematic diagram of the implementation in which a light wavelength conversion component and a light transmissive binder being mixed and provided inside a light transmissive supporting member in a dispersed manner, comprising a light wavelength conversion component 402, a light transmissive binder 405, a light transmissive supporting member 401 and an LED light source 403; and a part 404 between the light transmissive supporting member 401 and the LED light source 403 can be a gas: such as air, nitrogen and helium, and can also be in a vacuum state.

The LED light source in FIG. 3 or 4 can be preferably a white-light LED light source, and can even be further preferably an LED chip that emits blue light, wherein the periphery of the LED chip is provided with a white-light LED light source having yellow-light fluorescent powder or blue, green and red-light fluorescent powder.

The light wavelength conversion component in the present embodiment I can be fluorescent powder, phosphorescence powder and afterglow powder or any combination of the above-mentioned three powder; the light transmissive supporting member can be made from any light transmissive material, for example, a light transmissive component such as a lens and a light transmissive film, which can function to support a light performance parameter regulation member; and the light transmissive binding material can be selected from a solid and semi-solid glue or gel at normal temperature, and preferably is elastic gel.

A preparation method for the white light source performance compensation apparatus in this embodiment I can use a common existing preparation process, such as the process of injection moulding.

Embodiment II: A Light Performance Parameter Regulation Member is Located on an Outer Surface of a Light Transmissive Supporting Member As shown in FIGS. 5-8, the LED light source performance compensation apparatus comprises a light transmissive supporting member and a light performance parameter regulation member, wherein the light performance parameter regulation member comprises a light wavelength conversion component and a light transmissive binding material; and the light wavelength conversion component is provided on an outer surface of the light transmissive supporting member by means of a binding effect of the light transmissive binding material. The LED light source performance compensation apparatus covers the periphery of an LED light source, wherein a connection part between the LED light source and the LED light source performance compensation apparatus can be gas: such as air, nitrogen and helium, and can also be in a vacuum state, and even can use the method of completely filling or partially filling a light transmissive binding material in the above-mentioned connection part.

Figure 5:
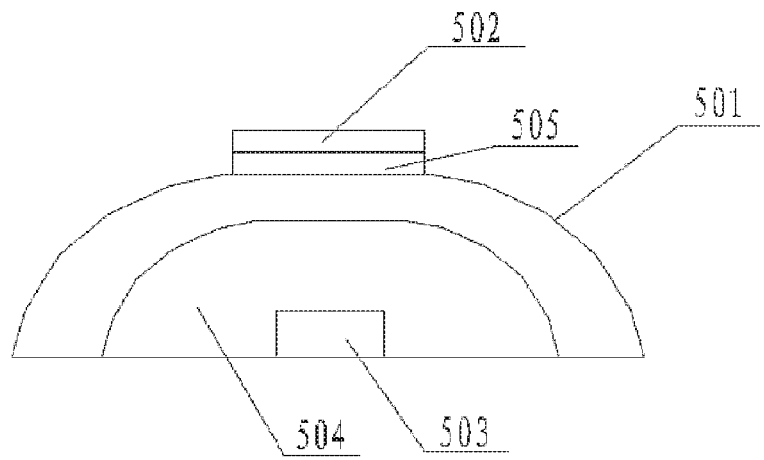
FIGS. 5-8 are structural schematic diagrams of particular embodiments of an LED light source performance compensation apparatus of the present invention in Embodiment II.
Figure 6:
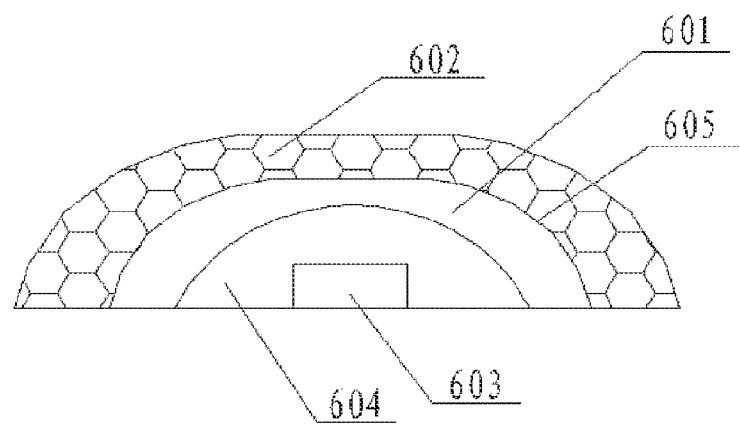

The light performance parameter adjustment member can also be formed as a film or provided on the outer surface of the light transmissive supporting member in a dispersed manner, with reference to the schematic diagram of FIG. 5 or 6.

FIG. 5 is a structural schematic diagram of an implementation in which a light wavelength conversion component is formed as a film separately and provided inside an outer surface of a light transmissive supporting member by means of the binding effect of a light transmissive binding material, comprising a light wavelength conversion component 502, a light transmissive supporting member 501, a light transmissive binding material 505 and an LED light source 503; and a part 504 between the light transmissive supporting member 501 and the LED light source 503 can be gas: such as air, nitrogen and helium, and can also be in a vacuum state; and the light wavelength conversion component 502 shown in FIG. 5 can be preferably a luminescent film in luminescent powder, and can even be further preferably a fluorescent film.

FIG. 6 is a structural schematic diagram of an implementation in which a light wavelength conversion component is provided inside an outer surface of a light transmissive supporting member in a dispersed manner by means of the binding effect of a light transmissive binding material, comprising a light wavelength conversion component 602, a light transmissive supporting member 601, a light transmissive binding material 605 and an LED light source 603; and a part 604 between the light transmissive supporting member 601 and the LED light source 603 can be gas: such as air, nitrogen and helium, and can also be in a vacuum state.

The LED light source in FIG. 5 or 6 can be preferably a white-light LED light source, and can even be further preferably an LED chip that emits blue light, wherein the periphery of the LED chip is provided with a white-light LED light source having yellow-light fluorescent powder or blue, green and red-light fluorescent powder.

The LED light source performance compensation apparatus can be separately provided between the light transmissive supporting member and the LED light source using a light transmissive binding material; and the refractive index of the light transmissive binding material is generally greater than that of the gas, especially the air. This implementation can excellently improve the light effect of secondary light emitted by the LED light source. Refer to the structural schematic diagram of FIG. 7 or 8.

Figure 7:
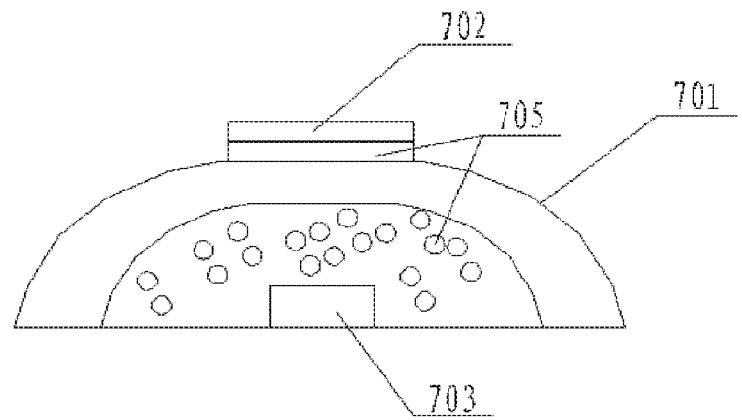
Figure 8:
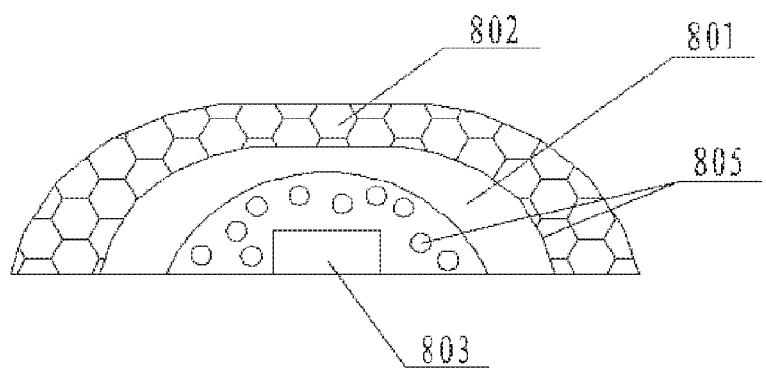

What is shown in FIG. 7 comprises a light wavelength conversion component 702, a light transmissive supporting member 701, a light transmissive binder 705 and an LED light source 703; and what is shown in FIG. 8 comprises a light wavelength conversion component 802, a light transmissive supporting member 801, a light transmissive binder 805 and an LED light source 803.

The light wavelength conversion component in the present embodiment II can be fluorescent powder, phosphorescence powder and afterglow powder or any combination of the above-mentioned three powder; the light transmissive supporting member can be made from any light transmissive material, for example, a light transmissive component such as a lens and a light transmissive film, which can function to support the light wavelength conversion component; and the light transmissive binder can be selected from a solid and semi-solid glue or gel at normal temperature.

A preparation method for the white light source performance compensation apparatus in this embodiment II can use a common existing preparation process, for example, an IMD process, IMD being short for an in-mold decoration technology, can be divided into IML, IMF and IMR. The IML is in-mold labelling. The surface of a label is a layer of hardened transparent thin film, and the middle is a printed pattern layer; and by means of an injection manufacturing process, the back of the label is combined with plastic, with luminescent powder printing ink of the printed pattern layer being sandwiched, so as to prevent the surface of a product from being shaved, and can keep the colour vibrant for a long term without fading easily. In the manufacturing process, the label is not stretched with a small curve surface, and is mainly used for 2D products. The IMF is in-mold forming, and the principle thereof is the same as that of the IML. The IMF process is as follows: the luminescent powder printing ink is firstly printed on a layer of thin film (the material thereof being PC or PET) with the thickness of approximately 0.05 mm-0.5 mm, the printed thin film is punched and high-pressure shaped to obtain a trimmed label, and then the label is placed into an injection machine and formed together with plastic particles in mold after being positioned by a mould positioning mechanism. In the manufacturing process, the label is highly stretched, and is mainly used for 3D products. In addition, the IMR is in-mold roller/reprint, and the difference lies in that there is no layer of transparent protective film on the surface of a final product.

Embodiment III: A Light Performance Parameter Regulation Member is Located Between an Inner Surface of a Light Transmissive Supporting Member and a Light Source As shown in FIGS. 9-12, the LED light source performance compensation apparatus comprises a light transmissive supporting member and a light performance parameter regulation member; the LED light source performance compensation apparatus covers the periphery of an LED light source; and a spacial part of an intervening connection between the LED light source and the LED light source performance compensation apparatus can be completely filled with a light wavelength conversion component, a light transmissive binding material, or a mixed composition of the light wavelength conversion component and the light transmissive binding material. The spacial part of an intervening connection between the above two can also be partially filled with the light wavelength conversion component, the light transmissive binding material, or the mixed composition of the light wavelength conversion component and the light transmissive binding material, and if partial filling is adopted, a spacial part that is not filled can be gas: such as air, nitrogen and helium, and can also be in a vacuum state, etc.

The light performance parameter regulation member can comprise a light wavelength conversion component and a light transmissive binding material, wherein the light wavelength conversion component is provided between an inner surface of a light transmissive supporting member and an LED light source by means of a binding effect of the light transmissive binding material. The light wavelength conversion component can also be formed as a film or provided in a spatial part between the inner surface of the light transmissive supporting member and the LED light source in a dispersed manner, with reference to the schematic diagram of FIG. 9 or 10.

Figure 9:
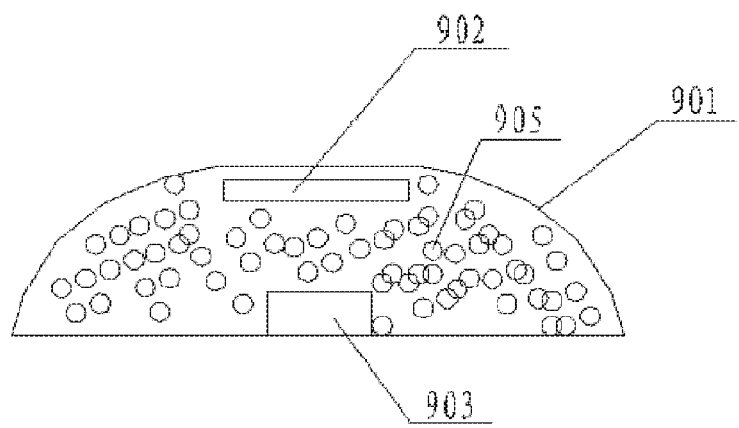
FIGS. 9-12 are structural schematic diagrams of particular embodiments of an LED light source performance compensation apparatus of the present invention in Embodiment III.

FIG. 9 is a structural schematic diagram of an implementation in which a light wavelength conversion component is formed as a film and provided in a spatial part between an inner surface of a light transmissive supporting member and an LED light source, comprising a light wavelength conversion component 902, a light transmissive supporting member 901, a light transmissive binding material 905 and an LED light source 903; and the light wavelength conversion component 902 shown in FIG. 9 can be preferably a luminescent film in luminescent powder, and can even be further preferably a fluorescent film.

Figure 10:
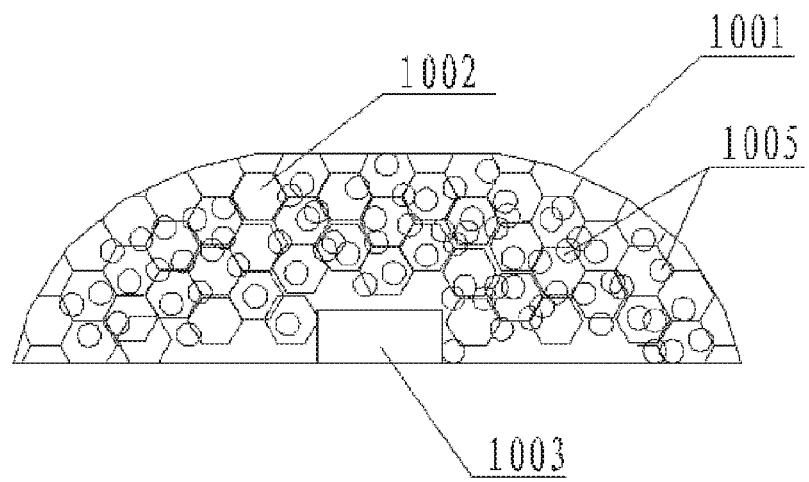

FIG. 10 is a structural schematic diagram of an implementation in which a light wavelength conversion component and a light transmissive binding material are jointly provided in a spatial part between an inner surface of a light transmissive supporting member and an LED light source in a dispersed manner, comprising a light wavelength conversion component 1002, a light transmissive supporting member 1001, a light transmissive binding material 1005 and an LED light source 1003.

The LED light source in FIG. 9 or 10 can be preferably a white-light LED light source, and can even be further preferably an LED chip that emits blue light, wherein the periphery of the LED chip is provided with a white-light LED light source having yellow-light fluorescent powder or blue, green and red-light fluorescent powder.

Figure 11:
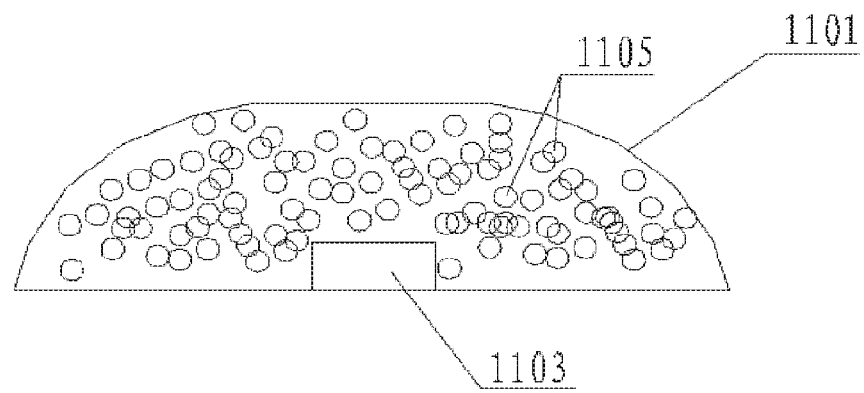
Figure 12:
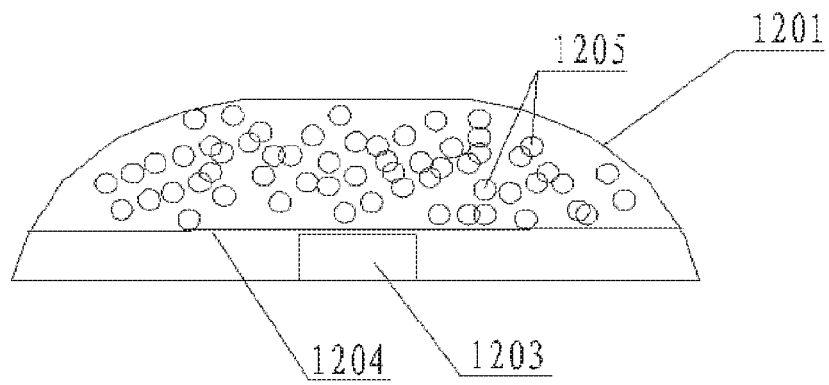

The LED light source performance compensation apparatus of the present invention can also be provided between an inner surface of a light transmissive supporting member and an LED light source separately using a light transmissive binding material, as shown in FIGS. 11 and 12.

FIG. 11 shows the case where a light transmissive binding material is completely filled between an inner surface of a light transmissive supporting member and an LED light source, comprising a light transmissive supporting member 1101, a light transmissive binding material 1105 and an LED light source 1103.

FIG. 12 shows the case where a light transmissive binding material is partially filled between an inner surface of a light transmissive supporting member and an LED light source, comprising a light transmissive supporting member 1201, a light transmissive binding material 1205 and an LED light source 1203; and a part 1204 that is not filled with the light transmissive binding material can be gas: such as air, nitrogen and helium, and can also be in a vacuum state.

The LED light source in FIG. 11 or 12 can be preferably a white-light LED light source, and can even be further preferably an LED chip that emits blue light, wherein the periphery of the LED chip is provided with a white-light LED light source having yellow-light fluorescent powder or blue, green and red-light fluorescent powder.

The light wavelength conversion component in the present embodiment III can be fluorescent powder, phosphorescence powder and afterglow powder or any combination of the above-mentioned three powder; the light transmissive supporting member can be made from any light transmissive material, for example, a light transmissive component such as a lens and a light transmissive film, which can function to support the light wavelength conversion component; and the light transmissive binder can be selected from a solid and semi-solid glue or gel at normal temperature.

A preparation method for the white light source performance compensation apparatus in this embodiment III can use a common existing preparation process, such as an IMD process and a luminescent powder whitewashing process.

Embodiment IV: The Coverage Degree of an LED Light Source Performance Compensation Apparatus and an LED Light Source The LED light source performance compensation apparatus of the present invention can use a light source plane that completely covers secondary light emitted by the LED light source, and can also use a light source plane that partially covers secondary light emitted by the LED light source. The LED light source performance compensation apparatus completely covering the light source plane can better improve the light effect and the colour temperature.

1. The LED Light Source Performance Compensation Apparatus Completely Covers the LED Light Source.

Figure 13:
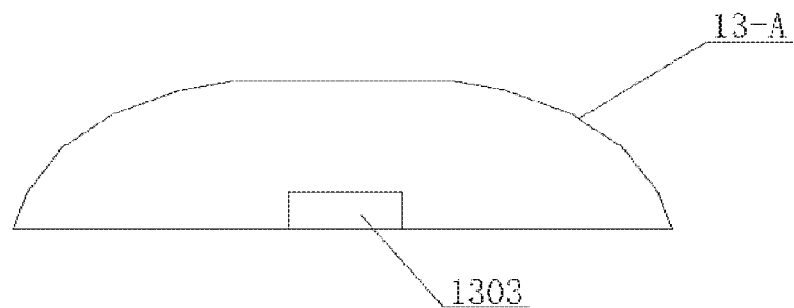
FIGS. 13-15 are structural schematic diagrams of particular embodiments of an LED light source performance compensation apparatus of the present invention in Embodiment IV.

Reference can be made to FIG. 13 for the structural schematic diagram of this implementation, comprising an LED light source performance compensation apparatus 13-A and an LED light source 1303, wherein the LED light source performance compensation apparatus 13-A completely covers a light source plane of light emitted by the LED light source 1303; the LED light source performance compensation apparatus can also contain a light transmissive supporting member and a light performance parameter regulation member, wherein the light performance parameter regulation member contains a wavelength conversion component and a light transmissive binding material; and the positional and connection relationships or compositions and the like among the light transmissive supporting member, the LED light source, the light wavelength conversion component and/or the light transmissive binding material can use any particular implementation of the aforementioned Embodiment I to Embodiment III.

2. The LED Light Source Performance Compensation Apparatus Partially Covers the Light Source Plane of the Light Emitted by the LED Light Source.

A. The LED Light Source Performance Compensation Apparatus Covers an Upper Surface Part of the Periphery of the LED Light Source.

Figure 14:
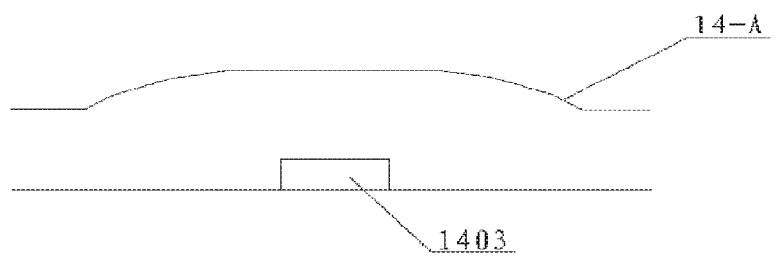

Reference can be made to FIG. 14 for the structural schematic diagram of this implementation, comprising an LED light source performance compensation apparatus 14-A and an LED light source 1403, wherein the LED light source performance compensation apparatus 14-A covers an upper surface part of the periphery of the LED light source 1403, i.e. one of the implementations of partially covering a light source plane of light emitted by the LED light source 1403. the LED light source performance compensation apparatus can also contain a light transmissive supporting member and a light performance parameter regulation member, wherein the light performance parameter regulation member contains a wavelength conversion component and a light transmissive binding material; and the positional and connection relationships or compositions and the like among the light transmissive supporting member, the LED light source, the light wavelength conversion component and/or the light transmissive binding material can all use any implementation of the aforementioned Embodiment I to Embodiment III.

B. The LED Light Source Performance Compensation Apparatus Covers a Side Surface Part of the Periphery of the LED Light Source.

Figure 15:
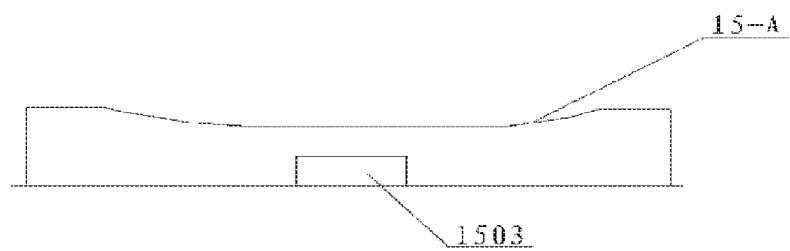

Reference can be made to FIG. 15 for the structural schematic diagram of this implementation, comprising an LED light source performance compensation apparatus 15-A and an LED light source 1503, wherein the LED light source performance compensation apparatus 15-A covers a side surface part of the periphery of the LED light source 1503, i.e. one of the implementations of partially covering a light source plane of light emitted by the LED light source 1503. the LED light source performance compensation apparatus can also contain a light transmissive supporting member and a light performance parameter regulation member, wherein the light performance parameter regulation member contains a wavelength conversion component and a light transmissive binding material; and the positional and connection relationships or compositions and the like among the light transmissive supporting member, the LED light source, the light wavelength conversion component and/or the light transmissive binding material can all use any implementation of the aforementioned Embodiment I to Embodiment III.

Figure 16:
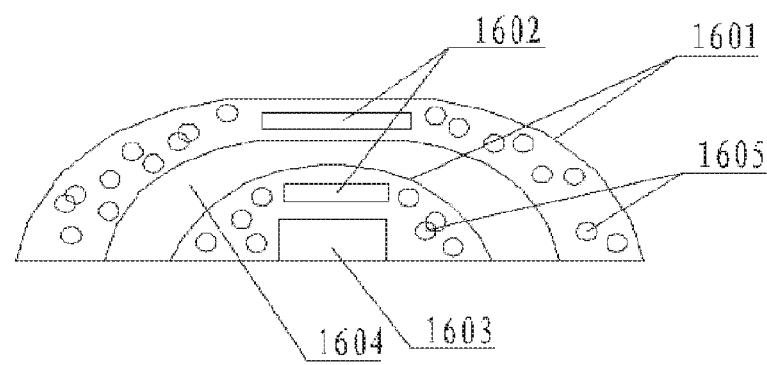
FIGS. 16-18 are structural schematic diagrams of particular embodiments of an LED light source performance compensation mechanism of the present invention in Embodiment V.

Embodiment V: The Positional Relationship Between a Light Wavelength Conversion Component and/or a Light Transmissive Binding Material and Multiple Layers of Light Transmissive Supporting Members In the LED light source performance compensation apparatus of the present invention, a single layer of light wavelength conversion component and/or light transmissive binding material can be used to connect to a single layer of light transmissive supporting member, and a connection combination of a single layer of light wavelength conversion component and/or light transmissive binding material and multiple layers of light transmissive supporting members can also be used, and a connection combination of multiple layers of light wavelength conversion components and/or light transmissive binding materials and multiple layers of light transmissive supporting members can further be used. Reference can be made to FIG. 16 for the particular implementation, comprising: a light wavelength conversion component 1602, a light transmissive binding material 1605, a light transmissive supporting member 1601 and an LED light source 1603; and a part 1604 between two adjacent layers of light transmissive supporting members 1601 can be gas: such as air, nitrogen and helium, and can also be in a vacuum state.

Figure 17:
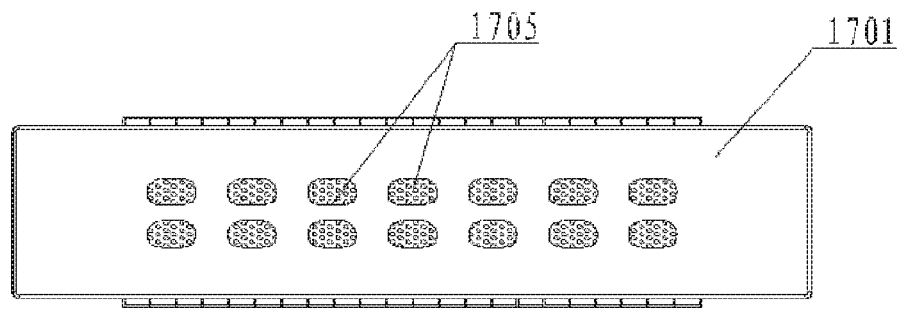
Figure 18:
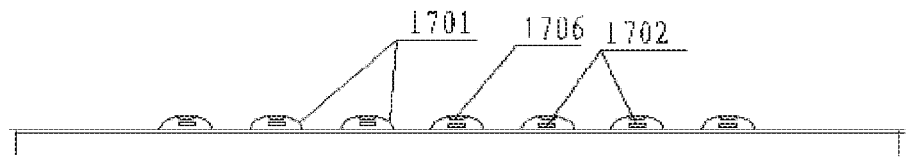

The LED light source performance compensation apparatus of the present invention can be applied to a single lamp bead and multiple lamp beads, preferably to the combination of multiple lamp beads; by means of this preferred approach, the LED light source performance compensation apparatus of the present invention can use the approach of providing a plurality of connection portions with the light wavelength conversion components and/or the light transmissive binding material on an integral light transmissive supporting member; and more preferably, the connection portions can be groove structures, wherein the groove structures match the positions of lamp beads of the LED light source. Further preferably, the light wavelength conversion component and/or the light transmissive binding material can be provided at a groove, so as to reduce the manufacturing cost of the LED light source performance compensation apparatus of the present invention, and facilitate assembling of a process of combining lamp beads. Reference can be made to FIGS. 17 and 18 for the structural schematic diagram of a particular implementation. FIG. 17 shows a top view of an LED light source performance compensation apparatus in which a plurality rows of light wavelength conversion components and a plurality rows of light transmissive binding materials are provided on a light transmissive supporting member. FIG. 18 is a front view of the structure shown in FIG. 17, comprising a light wavelength conversion component 1702, a light transmissive binding material 1705, a light transmissive supporting member 1701 and an LED light source 1703, wherein the light transmissive supporting member 1701 is provided with a groove 1706.

Embodiment VI: Assembling Effect Experiment

The structures of the lamp beads of the LED light source in the preferred implementations in the aforementioned Embodiment I to Embodiment V are used to conduct an effect experiment of performance parameters of light; and reference is made to the structures of FIGS. 17 and 18 to prepare the LED light source performance compensation apparatus for test.

Blank control 1: an LED light source, wherein the LED light source is a concept relative to the existing LED chip, and light emitted by the LED chip is light directly emitted from a semiconductor constituting the chip, i.e. primary light. However, the light emitted by the LED light source of the present invention is secondary light, i.e. the secondary light generated after wavelength conversion is performed via an existing light wavelength conversion component, such as fluorescent powder, on the primary light emitted from the semiconductor of the chip, wherein the secondary light emitted by the LED light source is visible light of which the wavelength is 380 nm-780 nm.

Control 2: The implementation represented in FIG. 12 comprises a white-light LED light source, a light transmissive supporting member and a light transmissive binding material, wherein the light transmissive supporting member completely covers a light source plane of light emitted by the white-light LED light source, and the light transmissive binding material partially fills a spatial part between an inner surface of the light transmissive supporting member and the white-light LED light source; and the light transmissive binding material can use any of the existing light transmissive binding materials (EHA 3055 of KCC corporation), and the light transmissive binding material can be preferably one of silica gel, such as Dow Corning (OE-6336).

Control 3: The implementation represented in FIG. 11 comprises a white-light LED light source, a light transmissive supporting member and a light transmissive binding material, wherein the light transmissive supporting member completely covers a light source plane of light emitted by the white-light LED light source, and the light transmissive binder completely fills a spatial part between an inner surface of the light transmissive supporting member and the white-light LED light source; and the light transmissive binding material can use any of the existing light transmissive binding materials (EHA 3055 of KCC corporation), and the light transmissive binding material can be preferably one of silica gel, such as Dow Corning (OE-6336).

Control 4: The implementation represented in FIG. 10 comprises a white-light LED light source, a light transmissive supporting member, a light transmissive binding material and a light wavelength conversion component, wherein the light transmissive supporting member completely covers a light source plane of light emitted by the white-light LED light source, and the light transmissive binding material and the light wavelength conversion component are jointly filled in a spatial part between an inner surface of the light transmissive supporting member and the white-light LED light source in a dispersed manner; the light transmissive binding material can use any of the existing light transmissive binding materials (EHA 3055 of KCC corporation), and the light transmissive binding material can be preferably one of silica gel, such as Dow Corning (OE-6336); and the light wavelength conversion component can be selected from any of the existing luminescent powder compositions, preferably fluorescent powder, particularly yellow-light fluorescent powder, red-light fluorescent powder and green-light fluorescent powder, etc.

Control 5: The implementation represented in FIG. 9 comprises a white-light LED light source, a light transmissive supporting member, a light transmissive binding material and a light wavelength conversion component, wherein the light transmissive supporting member completely covers a light source plane of light emitted by the white-light LED light source, the light transmissive binding material fills a spatial part between an inner surface of the light transmissive supporting member and the white-light LED light source, and the light wavelength conversion component is provided inside the light transmissive binding material after film forming; the light transmissive binding material can use any of the existing light transmissive binding materials (EHA 3055 of KCC corporation), and the light transmissive binding material can be preferably one of silica gel, such as Dow Corning (OE-6336); and the light wavelength conversion component can be selected from any of the existing luminescent powder compositions, preferably fluorescent powder, particularly yellow-light fluorescent powder, red-light fluorescent powder and green-light fluorescent powder, etc.

After the selection of the white-light LED light source and the selection of various compositions is performed in the implementations of the structures of the above-mentioned blank controls 1 and 2 and controls 3-6, the light performance parameters thereof are measured respectively; and the measurement method used is to use a distant DMS-80 spectrum analyser. Reference is made to Table I to Table V below for measured data.

TABLE I

|  | Type of light source | Light transmissive binding material | Light wavelength conversion component | Light effect (1 m/W) |
|---|---|---|---|---|
| Blank control 1 | White-light LED light source | — | — | 92.2 |
|  | Yellow-light LED light source | — | — | 66.5 |
|  | Blue-light LED light source | — | — | 7.4 |
|  | Green-light LED light source | — | — | 42.0 |
|  | Red-light LED light source | — | — | 30.9 |
| Control 2 | White-light LED light source | EHA3055 of KCC corporation | — | 92.4 |
|  | Yellow-light LED light source | EHA3055 of KCC corporation | — | 66.6 |
|  | Blue-light LED light source | EHA3055 of KCC corporation | — | 7.4 |
|  | Green-light LED light source | EHA3055 of KCC corporation | — | 42.1 |
|  | Red-light LED light source | EHA3055 of KCC corporation | — | 30.9 |
|  | White-light LED light source | OE-6336 of Dow Corning | — | 94.9 |
|  | Yellow-light LED light source | OE-6336 of Dow Corning | — | 68.5 |
|  | Blue-light LED light source | OE-6336 of Dow Corning | — | 7.6 |
|  | Green-light LED light source | OE-6336 of Dow Corning | — | 43.2 |
|  | Red-light LED light source | OE-6336 of Dow Corning | — | 31.8 |
| Control 3 | White-light LED light source | EHA3055 of KCC corporation | — | 95.0 |
|  | Yellow-light LED light source | EHA3055 of KCC corporation | — | 68.5 |
|  | Blue-light LED light source | EHA3055 of KCC corporation | — | 7.6 |
|  | Green-light LED light source | EHA3055 of KCC corporation | — | 43.3 |
|  | Red-light LED light source | EHA3055 of KCC corporation | — | 31.8 |
|  | White-light LED light source | OE-6336 of Dow Corning | — | 103.0 |
|  | Yellow-light LED light source | OE-6336 of Dow Corning | — | 74.2 |
|  | Blue-light LED light source | OE-6336 of Dow Corning | — | 8.3 |
|  | Green-light LED light source | OE-6336 of Dow Corning | — | 46.9 |
|  | Red-light LED light source | OE-6336 of Dow Corning | — | 34.5 |
| Control 4 | White-light LED light source | EHA3055 of KCC corporation | Red-light fluorescent powder | 90.0 |
|  | Yellow-light LED light source | EHA3055 of KCC corporation | Red-light fluorescent powder | 64.9 |
|  | Blue-light LED light source | EHA3055 of KCC corporation | Red-light fluorescent powder | 7.2 |
|  | Green-light LED light source | EHA3055 of KCC corporation | Red-light fluorescent powder | 41.0 |
|  | Red-light LED light source | EHA3055 of KCC corporation | Red-light fluorescent powder | 30.1 |
|  | White-light LED light source | OE-6336 of Dow Corning | Yellow-light fluorescent powder | 107.0 |
|  | Yellow-light LED light source | OE-6336 of Dow Corning | Yellow-light fluorescent powder | 77.1 |
|  | Blue-light LED light source | OE-6336 of Dow Corning | Yellow-light fluorescent powder | 8.6 |
|  | Green-light LED light source | OE-6336 of Dow Corning | Yellow-light fluorescent powder | 48.7 |
|  | Red-light LED light source | OE-6336 of Dow Corning | Yellow-light fluorescent powder | 35.8 |
| Control 5 | White-light LED light source | EHA3055 of KCC corporation | Green-light fluorescent powder | 89.0 |
|  | Yellow-light LED light source | EHA3055 of KCC corporation | Green-light fluorescent powder | 64.2 |
|  | Blue-light LED light source | EHA3055 of KCC corporation | Green-light fluorescent powder | 7.1 |

TABLE I-continued

| Type of light source | Light transmissive binding material | Light wavelength conversion component | Light effect (1 m/W) |
|---|---|---|---|
| Green-light LED light source | EHA3055 of KCC corporation | Green-light fluorescent powder | 40.5 |
| Red-light LED light source | EHA3055 of KCC corporation | Green-light fluorescent powder | 29.8 |
| White-light LED light source | OE-6336 of Dow Corning | Blue-light fluorescent powder | 92.0 |
| Yellow-light LED light source | OE-6336 of Dow Corning | Blue-light fluorescent powder | 66.3 |
| Blue-light LED light source | OE-6336 of Dow Corning | Blue-light fluorescent powder | 7.4 |
| Green-light LED light source | OE-6336 of Dow Corning | Blue-light fluorescent powder | 41.9 |
| Red-light LED light source | OE-6336 of Dow Corning | Blue-light fluorescent powder | 30.8 |

It can be seen from the result of Table I that the use of the LED light source performance compensation apparatus in the implementations of the present invention can effectively regulate the light effect of secondary light of which the wavelength is 380 nm-780 nm and which is emitted by an LED light source with different light colours; and especially for the existing white-light LED light source, degraded products with insufficient light effect in finished white-light LED light sources can be more effectively recycled and dealt with.

Furthermore, compared with the case of not using a light transmissive binding material, the light effects of samples are significantly different when light transmissive binding materials with different performances are used, and the light effect also changes when the approaches of using the light transmissive binding material are different; when the light transmissive binding material is completely filled in the part between the inner surface of the light transmissive supporting member and the LED light source, the light effect is superior to that of partial filling; and after the light wavelength conversion component is used, the function of regulating the light effect can be realized after yellow, red and green luminescent powder is added, wherein the sequence of the magnitude of the light effect is sequentially: adding the yellow luminescent powder, the green luminescent powder and the red luminescent powder.

TABLE II

| | Type of light source | Light transmissive binding material | Light wavelength conversion component | Colour rendering index |
|---|---|---|---|---|
| Blank control 1 | White-light LED light source | — | — | 75.9 |
| | Yellow-light LED light source | — | — | 67.3 |
| | Blue-light LED light source | — | — | 30.1 |
| | Green-light LED light source | — | — | 41.3 |
| | Red-light LED light source | — | — | 52.4 |
| Control 2 | White-light LED light source | EHA3055 of KCC corporation | — | 76.1 |
| | Yellow-light LED light source | EHA3055 of KCC corporation | — | 67.3 |
| | Blue-light LED light source | EHA3055 of KCC corporation | — | 30.1 |
| | Green-light LED light source | EHA3055 of KCC corporation | — | 41.3 |
| | Red-light LED light source | EHA3055 of KCC corporation | — | 52.4 |
| | White-light LED light source | OE-6336 of Dow Corning | — | 77.2 |
| | Yellow-light LED light source | OE-6336 of Dow Corning | — | 68.2 |
| | Blue-light LED light source | OE-6336 of Dow Corning | — | 30.5 |
| | Green-light LED light source | OE-6336 of Dow Corning | — | 41.9 |
| | Red-light LED light source | OE-6336 of Dow Corning | — | 53.1 |
| Control 3 | White-light LED light source | EHA3055 of KCC corporation | — | 76.2 |
| | Yellow-light LED light source | EHA3055 of KCC corporation | — | 67.3 |
| | Blue-light LED light source | EHA3055 of KCC corporation | — | 30.1 |

TABLE II-continued

| | Type of light source | Light transmissive binding material | Light wavelength conversion component | Colour rendering index |
|---|---|---|---|---|
| | Green-light LED light source | EHA3055 of KCC corporation | — | 41.3 |
| | Red-light LED light source | EHA3055 of KCC corporation | — | 52.4 |
| | White-light LED light source | OE-6336 of Dow Corning | — | 77.3 |
| | Yellow-light LED light source | OE-6336 of Dow Corning | — | 68.2 |
| | Blue-light LED light source | OE-6336 of Dow Corning | — | 30.5 |
| | Green-light LED light source | OE-6336 of Dow Corning | — | 41.9 |
| | Red-light LED light source | OE-6336 of Dow Corning | — | 53.1 |
| Control 4 | White-light LED light source | EHA3055 of KCC corporation | Yellow-light fluorescent powder | 79.1 |
| | Yellow-light LED light source | EHA3055 of KCC corporation | Yellow-light fluorescent powder | 70.0 |
| | Blue-light LED light source | EHA3055 of KCC corporation | Yellow-light fluorescent powder | 31.2 |
| | Green-light LED light source | EHA3055 of KCC corporation | Yellow-light fluorescent powder | 42.9 |
| | Red-light LED light source | EHA3055 of KCC corporation | Yellow-light fluorescent powder | 54.5 |
| | White-light LED light source | OE-6336 of Dow Corning | Red-light fluorescent powder | 85.2 |
| | Yellow-light LED light source | OE-6336 of Dow Corning | Red-light fluorescent powder | 75.3 |
| | Blue-light LED light source | OE-6336 of Dow Corning | Red-light fluorescent powder | 33.6 |
| | Green-light LED light source | OE-6336 of Dow Corning | Red-light fluorescent powder | 46.2 |
| | Red-light LED light source | OE-6336 of Dow Corning | Red-light fluorescent powder | 58.6 |
| Control 5 | White-light LED light source | EHA3055 of KCC corporation | Green-light fluorescent powder | 81.1 |
| | Yellow-light LED light source | EHA3055 of KCC corporation | Green-light fluorescent powder | 71.8 |
| | Blue-light LED light source | EHA3055 of KCC corporation | Green-light fluorescent powder | 32.0 |
| | Green-light LED light source | EHA3055 of KCC corporation | Green-light fluorescent powder | 44.0 |
| | Red-light LED light source | EHA3055 of KCC corporation | Green-light fluorescent powder | 55.8 |
| | White-light LED light source | OE-6336 of Dow Corning | Blue-light fluorescent powder | 83.3 |
| | Yellow-light LED light source | OE-6336 of Dow Corning | Blue-light fluorescent powder | 73.5 |
| | Blue-light LED light source | OE-6336 of Dow Corning | Blue-light fluorescent powder | 32.8 |
| | Green-light LED light source | OE-6336 of Dow Corning | Blue-light fluorescent powder | 45.1 |
| | Red-light LED light source | OE-6336 of Dow Corning | Blue-light fluorescent powder | 57.2 |

It can be seen from the result of Table II that the use of the LED light source performance compensation apparatus in the implementations of the present invention can effectively regulate the colour rendering index of secondary light of which the wavelength is 380 nm-780 nm and which is emitted by an LED light source with different light colours; and especially for the existing white-light LED light source, degraded products with insufficient colour rendering indexes in finished white-light LED light sources can be more effectively recycled and dealt with.

Furthermore, compared with the case of not using a light transmissive binding material, the colour rendering indexes of samples are significantly different when light transmissive binding materials with different performances are used, and the colour rendering index also changes when the approaches of using the light transmissive binding material are different; when the light transmissive binding material is completely filled in the part between the inner surface of the light transmissive supporting member and the LED light source, the colour rendering index is superior to that of partial filling; and after the light wavelength conversion component is used, the function of regulating the colour rendering index can be realized after yellow, red and green luminescent powder is added, wherein the sequence of the magnitude of the colour rendering index is sequentially: adding the red luminescent powder, the green luminescent powder and the yellow luminescent powder.

TABLE III

| | Type of light source | Light transmissive binding material | Light wavelength conversion component | Peak proportion of blue light and yellow light in light-emitting spectrum (%) |
|---|---|---|---|---|
| | White-light LED light source | — | — | 104.2 |
| | Yellow-light LED light source | — | — | 33.0 |
| | Blue-light LED light source | — | — | 321.6 |
| | Green-light LED light source | — | — | 62.7 |
| | Red-light LED light source | — | — | 76.1 |
| Control 2 | White-light LED light source | EHA3055 of KCC corporation | — | 93.0 |
| | Yellow-light LED light source | EHA3055 of KCC corporation | — | 29.5 |
| | Blue-light LED light source | EHA3055 of KCC corporation | — | 287.0 |
| | Green-light LED light source | EHA3055 of KCC corporation | — | 55.9 |
| | Red-light LED light source | EHA3055 of KCC corporation | — | 67.9 |
| | White-light LED light source | OE-6336 of Dow Corning | — | 87.1 |
| | Yellow-light LED light source | OE-6336 of Dow Corning | — | 27.6 |
| | Blue-light LED light source | OE-6336 of Dow Corning | — | 268.8 |
| | Green-light LED light source | OE-6336 of Dow Corning | — | 52.4 |
| | Red-light LED light source | OE-6336 of Dow Corning | — | 63.6 |
| Control 3 | White-light LED light source | EHA3055 of KCC corporation | — | 98.9 |
| | Yellow-light LED light source | EHA3055 of KCC corporation | — | 31.3 |
| | Blue-light LED light source | EHA3055 of KCC corporation | — | 305.2 |
| | Green-light LED light source | EHA3055 of KCC corporation | — | 59.5 |
| | Red-light LED light source | EHA3055 of KCC corporation | — | 72.2 |
| | White-light LED light source | OE-6336 of Dow Corning | — | 87.0 |
| | Yellow-light LED light source | OE-6336 of Dow Corning | — | 29.5 |
| | Blue-light LED light source | OE-6336 of Dow Corning | — | 287.6 |
| | Green-light LED light source | OE-6336 of Dow Corning | — | 56.1 |
| | Red-light LED light source | OE-6336 of Dow Corning | — | 68.1 |
| Control 4 | White-light LED light source | EHA3055 of KCC corporation | Yellow-light fluorescent powder | 82.0 |
| | Yellow-light LED light source | EHA3055 of KCC corporation | Yellow-light fluorescent powder | 11.9 |
| | Blue-light LED light source | EHA3055 of KCC corporation | Yellow-light fluorescent powder | 295.9 |
| | Green-light LED light source | EHA3055 of KCC corporation | Yellow-light fluorescent powder | 41.1 |
| | Red-light LED light source | EHA3055 of KCC corporation | Yellow-light fluorescent powder | 54.3 |
| | White-light LED light source | OE-6336 of Dow Corning | Red-light fluorescent powder | 76.0 |
| | Yellow-light LED light source | OE-6336 of Dow Corning | Red-light fluorescent powder | 24.1 |
| | Blue-light LED light source | OE-6336 of Dow Corning | Red-light fluorescent powder | 234.5 |
| | Green-light LED light source | OE-6336 of Dow Corning | Red-light fluorescent powder | 45.7 |
| | Red-light LED light source | OE-6336 of Dow Corning | Red-light fluorescent powder | 55.5 |
| Control 5 | White-light LED light source | EHA3055 of KCC corporation | Green-light fluorescent powder | 79.9 |
| | Yellow-light LED light source | EHA3055 of KCC corporation | Green-light fluorescent powder | 25.3 |

TABLE III-continued

| Type of light source | Light transmissive binding material | Light wavelength conversion component | Peak proportion of blue light and yellow light in light-emitting spectrum (%) |
|---|---|---|---|
| Blue-light LED light source | EHA3055 of KCC corporation | Green-light fluorescent powder | 246.6 |
| Green-light LED light source | EHA3055 of KCC corporation | Green-light fluorescent powder | 48.1 |
| Red-light LED light source | EHA3055 of KCC corporation | Green-light fluorescent powder | 58.3 |
| White-light LED light source | OE-6336 of Dow Corning | Blue-light fluorescent powder | 116.8 |
| Yellow-light LED light source | OE-6336 of Dow Corning | Blue-light fluorescent powder | 46.7 |
| Blue-light LED light source | OE-6336 of Dow Corning | Blue-light fluorescent powder | 330.7 |
| Green-light LED light source | OE-6336 of Dow Corning | Blue-light fluorescent powder | 75.9 |
| Red-light LED light source | OE-6336 of Dow Corning | Blue-light fluorescent powder | 89.1 |

It can be seen from the result of Table III that the use of the LED light source performance compensation apparatus in the implementations of the present invention can effectively regulate the proportion of blue light of secondary light of which the wavelength is 380 nm-780 nm and which is emitted by an LED light source with different light colours; and especially for the existing white-light LED light source, degraded products with a defective proportion of blue light in finished white-light LED light sources can be more effectively recycled and dealt with.

Furthermore, compared with the case of not using a light transmissive binding material, a peak proportion of blue light and yellow light is reduced significantly in the spectrum of the sample when light transmissive binding materials with different performances are used, and the peak proportion of blue light and yellow light also changes in the spectrum when the approaches of using the light transmissive binding material are different; when the light transmissive binding material is completely filled in the part between the inner surface of the light transmissive supporting member and the LED light source, the peak proportion of blue light and yellow light is greater than that of partial filling; and after the light wavelength conversion component is used, the function of regulating the proportion of blue light can be realized after yellow, red and green luminescent powder is added, wherein the sequence of the magnitude of the peak proportion of blue light and yellow light is sequentially: adding the yellow luminescent powder, the green luminescent powder and the red luminescent powder.

Figure 19:
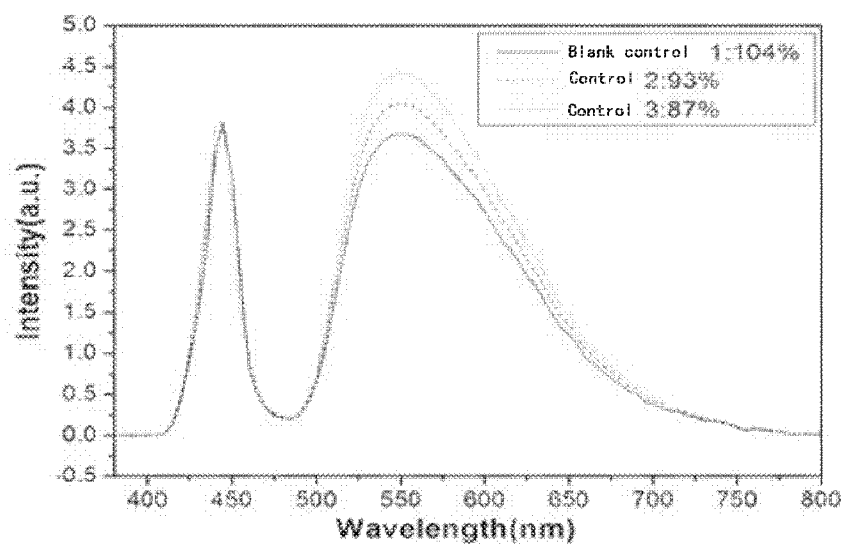
FIG. 19 is a measurement diagram of the performance parameter of a proportion of blue light in Embodiment VI.

FIG. 19 shows a parameter measurement diagram when measuring the proportion of blue light in blank control 1 and control 2 and control 3 in the above-mentioned Tables, comprising two particular implementations in blank control 1 and control 2 and control 3.

TABLE IV

| | Type of light source | Light transmissive binding material | Light wavelength conversion component | Colour tolerance |
|---|---|---|---|---|
| Blank control 1 | White-light LED light source | — | — | 6.0 |
| | Yellow-light LED light source | — | — | 9.6 |
| | Blue-light LED light source | — | — | 12.7 |
| | Green-light LED light source | — | — | 11.6 |
| | Red-light LED light source | — | — | 10.0 |
| Control 2 | White-light LED light source | EHA3055 of KCC corporation | — | 6.2 |
| | Yellow-light LED light source | EHA3055 of KCC corporation | — | 9.9 |
| | Blue-light LED light source | EHA3055 of KCC corporation | — | 13.1 |
| | Green-light LED light source | EHA3055 of KCC corporation | — | 11.9 |
| | Red-light LED light source | EHA3055 of KCC corporation | — | 10.4 |
| | White-light LED light source | OE-6336 of Dow Corning | — | 6.1 |
| | Yellow-light LED light source | OE-6336 of Dow Corning | — | 9.8 |
| | Blue-light LED light source | OE-6336 of Dow Corning | — | 13.0 |
| | Green-light LED | OE-6336 of Dow | | 11.8 |

TABLE IV-continued

|  | Type of light source | Light transmissive binding material | Light wavelength conversion component | Colour tolerance |
|---|---|---|---|---|
|  | light source | Corning |  |  |
|  | Red-light LED light source | OE-6336 of Dow Corning | — | 10.2 |
| Control 3 | White-light LED light source | EHA3055 of KCC corporation | — | 5.0 |
|  | Yellow-light LED light source | EHA3055 of KCC corporation | — | 8.0 |
|  | Blue-light LED light source | EHA3055 of KCC corporation | — | 10.6 |
|  | Green-light LED light source | EHA3055 of KCC corporation | — | 9.6 |
|  | Red-light LED light source | EHA3055 of KCC corporation | — | 8.4 |
|  | White-light LED light source | OE-6336 of Dow Corning | — | 5.2 |
|  | Yellow-light LED light source | OE-6336 of Dow Corning | — | 8.3 |
|  | Blue-light LED light source | OE-6336 of Dow Corning | — | 11.0 |
|  | Green-light LED light source | OE-6336 of Dow Corning | — | 10.0 |
|  | Red-light LED light source | OE-6336 of Dow Corning | — | 8.7 |
| Control 4 | White-light LED light source | EHA3055 of KCC corporation | Yellow-light fluorescent powder | 7.0 |
|  | Yellow-light LED light source | EHA3055 of KCC corporation | Yellow-light fluorescent powder | 11.2 |
|  | Blue-light LED light source | EHA3055 of KCC corporation | Yellow-light fluorescent powder | 14.8 |
|  | Green-light LED light source | EHA3055 of KCC corporation | Yellow-light fluorescent powder | 13.5 |
|  | Red-light LED light source | EHA3055 of KCC corporation | Yellow-light fluorescent powder | 11.7 |
|  | White-light LED light source | OE-6336 of Dow Corning | Red-light fluorescent powder | 4.3 |
|  | Yellow-light LED light source | OE-6336 of Dow Corning | Red-light fluorescent powder | 6.6 |
|  | Blue-light LED light source | OE-6336 of Dow Corning | Red-light fluorescent powder | 8.7 |
|  | Green-light LED light source | OE-6336 of Dow Corning | Red-light fluorescent powder | 7.9 |
|  | Red-light LED light source | OE-6336 of Dow Corning | Red-light fluorescent powder | 6.9 |
| Control 5 | White-light LED light source | EHA3055 of KCC corporation | Green-light fluorescent powder | 4.2 |
|  | Yellow-light LED light source | EHA3055 of KCC corporation | Green-light fluorescent powder | 6.8 |
|  | Blue-light LED light source | EHA3055 of KCC corporation | Green-light fluorescent powder | 9.0 |
|  | Green-light LED light source | EHA3055 of KCC corporation | Green-light fluorescent powder | 8.2 |
|  | Red-light LED light source | EHA3055 of KCC corporation | Green-light fluorescent powder | 7.1 |
|  | White-light LED light source | OE-6336 of Dow Corning | Blue-light fluorescent powder | 3.0 |
|  | Yellow-light LED light source | OE-6336 of Dow Corning | Blue-light fluorescent powder | 4.8 |
|  | Blue-light LED light source | OE-6336 of Dow Corning | Blue-light fluorescent powder | 6.4 |
|  | Green-light LED light source | OE-6336 of Dow Corning | Blue-light fluorescent powder | 5.8 |
|  | Red-light LED light source | OE-6336 of Dow Corning | Blue-light fluorescent powder | 5.0 |

It can be seen from the result of Table IV that the use of the LED light source performance compensation apparatus in the implementations of the present invention can effectively regulate the colour tolerance of secondary light of which the wavelength is 380 nm-780 nm and which is emitted by an LED light source with different light colours; and especially for the existing white-light LED light source, degraded products with defective colour tolerance in finished white-light LED light sources can be more effectively recycled and dealt with.

Furthermore, compared with the case of not using a light transmissive binder, the colour tolerance of the sample is slightly reduced when light transmissive binding materials with different performances are used, and the colour tolerance also changes when the approaches of using the light transmissive binder are different; when the light transmissive binder is completely filled in the part between the inner surface of the light transmissive supporting member and the LED light source, the colour tolerance is superior to that of partial filling; and after the light wavelength conversion component is used, the function of regulating the colour tolerance can be realized after yellow, red and green luminescent powder is added, wherein the sequence of numerical magnitude of the colour tolerance is sequentially: adding the yellow luminescent powder, the red luminescent powder and the green luminescent powder.

TABLE V

|  | Type of light source | Light transmissive binding material | Light wavelength conversion component | Relevant colour temperature (K) |
|---|---|---|---|---|
| Blank control 1 | White-light LED light source | — | — | 5687.6 |
|  | Yellow-light LED light source | — | — | 5270.6 |
|  | Blue-light LED light source | — | — | 6681.9 |
|  | Green-light LED light source | — | — | 6491.4 |
|  | Red-light LED light source | — | — | 5102.0 |
| Control 2 | White-light LED light source | EHA3055 of KCC corporation | — | 5712.0 |
|  | Yellow-light LED light source | EHA3055 of KCC corporation | — | 5293.2 |
|  | Blue-light LED light source | EHA3055 of KCC corporation | — | 6710.5 |
|  | Green-light LED light source | EHA3055 of KCC corporation | — | 6519.2 |
|  | Red-light LED light source | EHA3055 of KCC corporation | — | 5123.8 |
|  | White-light LED light source | OE-6336 of Dow Corning | — | 5708.0 |
|  | Yellow-light LED light source | OE-6336 of Dow Corning | — | 5289.4 |
|  | Blue-light LED light source | OE-6336 of Dow Corning | — | 6705.8 |
|  | Green-light LED light source | OE-6336 of Dow Corning | — | 6514.6 |
|  | Red-light LED light source | OE-6336 of Dow Corning | — | 5120.2 |
| Control 3 | White-light LED light source | EHA3055 of KCC corporation | — | 5714.0 |
|  | Yellow-light LED light source | EHA3055 of KCC corporation | — | 5295.0 |
|  | Blue-light LED light source | EHA3055 of KCC corporation | — | 6712.9 |
|  | Green-light LED light source | EHA3055 of KCC corporation | — | 6521.5 |
|  | Red-light LED light source | EHA3055 of KCC corporation | — | 5125.6 |
|  | White-light LED light source | OE-6336 of Dow Corning | — | 5704.0 |
|  | Yellow-light LED light source | OE-6336 of Dow Corning | — | 5285.7 |
|  | Blue-light LED light source | OE-6336 of Dow Corning | — | 6701.1 |
|  | Green-light LED light source | OE-6336 of Dow Corning | — | 6510.1 |
|  | Red-light LED light source | OE-6336 of Dow Corning | — | 5116.7 |
| Control 4 | White-light LED light source | EHA3055 of KCC corporation | Yellow-light fluorescent powder | 5784.5 |
|  | Yellow-light LED light source | EHA3055 of KCC corporation | Yellow-light fluorescent powder | 5369.9 |
|  | Blue-light LED light source | EHA3055 of KCC corporation | Yellow-light fluorescent powder | 6773.0 |
|  | Green-light LED light source | EHA3055 of KCC corporation | Yellow-light fluorescent powder | 6583.6 |
|  | Red-light LED light source | EHA3055 of KCC corporation | Yellow-light fluorescent powder | 5202.2 |
|  | White-light LED light source | OE-6336 of Dow Corning | Red-light fluorescent powder | 4853.5 |
|  | Yellow-light LED light source | OE-6336 of Dow Corning | Red-light fluorescent powder | 4438.9 |
|  | Blue-light LED light source | OE-6336 of Dow Corning | Red-light fluorescent powder | 5842.0 |
|  | Green-light LED light source | OE-6336 of Dow Corning | Red-light fluorescent powder | 5652.6 |

TABLE V-continued

|  | Type of light source | Light transmissive binding material | Light wavelength conversion component | Relevant colour temperature (K) |
|---|---|---|---|---|
| | Red-light LED light source | OE-6336 of Dow Corning | Red-light fluorescent powder | 4271.2 |
| Control 5 | White-light LED light source | EHA3055 of KCC corporation | Green-light fluorescent powder | 5767.5 |
| | Yellow-light LED light source | EHA3055 of KCC corporation | Green-light fluorescent powder | 5352.9 |
| | Blue-light LED light source | EHA3055 of KCC corporation | Green-light fluorescent powder | 6756.0 |
| | Green-light LED light source | EHA3055 of KCC corporation | Green-light fluorescent powder | 6566.6 |
| | Red-light LED light source | EHA3055 of KCC corporation | Green-light fluorescent powder | 5185.2 |
| | White-light LED light source | OE-6336 of Dow Corning | Blue-light fluorescent powder | 5861.5 |
| | Yellow-light LED light source | OE-6336 of Dow Corning | Blue-light fluorescent powder | 5446.9 |
| | Blue-light LED light source | OE-6336 of Dow Corning | Blue-light fluorescent powder | 6850.0 |
| | Green-light LED light source | OE-6336 of Dow Corning | Blue-light fluorescent powder | 6660.6 |
| | Red-light LED light source | OE-6336 of Dow Corning | Blue-light fluorescent powder | 5279.2 |

It can be seen from the result of Table V that the use of the LED light source performance compensation apparatus in the implementations of the present invention can effectively regulate the relevant colour temperature of secondary light of which the wavelength is 380 nm-780 nm and which is emitted by an LED light source with different light colours; and especially for the existing white-light LED light source, degraded products with a defective relevant colour temperature in finished white-light LED light sources can be more effectively recycled and dealt with.

Furthermore, compared with the case of not using a light transmissive binder, the relevant colour temperature change insignificantly when light transmissive binding materials with different performances are used, and there is also no great change in the relevant colour temperature when the approaches of using the light transmissive binder are different; when the light transmissive binder is completely or partially filled in the part between the inner surface of the light transmissive supporting member and the LED light source, there is also no significant change in the relevant colour temperature of the sample; and after the light wavelength conversion component is used, the function of regulating the relevant colour temperature can be realized after yellow, red and green luminescent powder is added, wherein the relevant sequence of the magnitude is sequentially: adding the green luminescent powder, the yellow luminescent powder and the red luminescent powder.

In Tables I to V above, the luminescent powder used is as follows: the yellow fluorescent powder is Y-04 available from Intematix, the red fluorescent powder is 0763 available from GRINM, the green fluorescent powder is G2762 available from Intematix, and the blue-green fluorescent powder is LNBG490 available from RoHS.

It can be seen from Tables I to V above that by means of the LED light source performance compensation apparatus of the present invention, the performance parameters of the existing LED light source, especially light emergent from a white-light LED light source, can be effectively regulated, and a corresponding light wavelength conversion component and/or light transmissive binding material can be selected according to different performance regulations in addition to the above-mentioned performance parameters.

The above implementations are only preferred implementations of the present invention, and it should be noted that the above-mentioned preferred implementations should not be deemed as limitations to the present invention, and the protection scope of the present invention shall be subject to the scope defined in the claims. For those skilled in the art, several improvements and decorations can also be made without departing from the spirit and scope of the present invention, and these improvements and decorations shall also be deemed as the protection scope of the present invention.

The invention claimed is:

1. An LED light source performance compensation apparatus, comprising:
   a light transmissive supporting member; and a light performance parameter regulation member, wherein after secondary light with the wavelength of 380 nm-780 nm emitted by an LED light source passes through the performance compensation apparatus, light performance parameters are adjusted by the light performance parameter regulation member, the light performance parameter regulation member comprises a light wavelength conversion component and/or a light transmissive binding material, and the light wavelength conversion component is luminescent powder.

2. The LED light source performance compensation apparatus according to claim 1, wherein the light performance parameter regulation member is provided on an outer surface of or inside the light transmissive supporting member or between an inner surface of the light transmissive supporting member and the LED light source.

3. The LED light source performance compensation apparatus according to claim 1, wherein a groove is provided on the light transmissive supporting member, and the light performance parameter regulation member is provided in the groove.

4. The LED light source performance compensation apparatus according to claim 1, wherein the luminescent powder is fluorescent powder or a fluorescent film.

5. The LED light source performance compensation apparatus according to claim 4, wherein the fluorescent powder is yellow-light fluorescent powder, green-light fluorescent powder, red-light fluorescent powder or blue-light fluorescent powder.

6. The LED light source performance compensation apparatus according to claim 1, wherein the light transmissive binding material is an elastic binding material.

7. The LED light source performance compensation apparatus according to claim 1, wherein the light transmissive supporting member is a lens.

8. The LED light source performance compensation apparatus according to claim 1, wherein the light performance parameter regulation member comprises a light wavelength conversion component and a light transmissive binding material;
   the light wavelength conversion component is fluorescent powder or a fluorescent film;
   several grooves are provided on the light transmissive supporting member, and the light transmissive binding material is provided in the grooves; and the fluorescent powder or the fluorescent film is provided in the light transmissive binding material.

9. The LED light source performance compensation apparatus according to claim 8, wherein the light transmissive binding material is elastic gel.

10. A method for making the light source performance compensation apparatus of claim 8, comprising the step of:
    producing the light source performance compensation apparatus using an IMD process, wherein the IMD process is any one selected from IML, IMF and IMR.

11. A method for using the LED light source performance compensation apparatus of claim 1, comprising:
    installing the performance compensation apparatus in an LED light-emitting device having an LED light source, wherein the performance compensation apparatus regulates light performance parameters of secondary light emitted by the LED light source in the wavelength of 380 nm-780 nm.

12. The method according to claim 11, wherein the colour of the secondary light emitted by the LED light source is any one of blue, yellow, green, red and white.

13. The method according to claim 11, wherein the LED light source is a white-light LED light source or an LED panel lamp.

14. A white-light LED light-emitting device, comprising:
    a white-light LED light source; and
    the LED light source performance compensation apparatus of claim 1.

* * * * *